United States Patent [19]

Okada

[11] Patent Number: 5,462,891

[45] Date of Patent: Oct. 31, 1995

[54] PROCESS FOR MANUFACTURING A SEMICONDUCTOR DEVICE USING $NH_4OH$-$H_2O_2$ BASED ETCHANT FOR TI BASED THIN FILM

[75] Inventor: Junji Okada, Kanagawa, Japan

[73] Assignee: Fuji Xerox Co., Ltd., Tokyo, Japan

[21] Appl. No.: 231,293

[22] Filed: Apr. 22, 1994

[30] Foreign Application Priority Data

Apr. 23, 1993 [JP] Japan .................................. 5-119282

[51] Int. Cl.⁶ ........................... H01L 21/44; H01L 21/48
[52] U.S. Cl. ........................ 437/187; 437/192; 437/190
[58] Field of Search ........................... 156/664; 437/187, 437/192, 190

[56]  References Cited

U.S. PATENT DOCUMENTS

| | | |
|---|---|---|
| 4,638,347 | 1/1987 | Iyer ............................. 357/34 |
| 4,948,755 | 8/1990 | Mo ............................. 437/195 |
| 5,047,367 | 9/1991 | Wei et al. .................... 437/200 |
| 5,053,083 | 10/1991 | Sinton ....................... 136/256 |
| 5,274,482 | 12/1993 | Morita et al. ................ 359/54 |
| 5,298,437 | 3/1994 | McFarlane et al. ......... 437/31 |
| 5,298,458 | 3/1994 | Arikawa et al. ............ 437/183 |

FOREIGN PATENT DOCUMENTS 63-020489  1/1988  Japan ................................ 156/664

Primary Examiner—Olik Chaudhuri
Assistant Examiner—Richard A. Booth
Attorney, Agent, or Firm—Finnegan, Henderson, Farabow, Garrett & Dunner

[57]  ABSTRACT

If a resist pattern is formed on a titanium-based thin film, and a titanium-based thin film is etched with an $NH_4OH$—$H_2O_2$—$H_2O$-based etching solution with an ammonia concentration of 3% or less, irregularities on pattern faces due to etching can be eliminated, and the amount of side etching at the titanium thin film below the resist pattern ends can be suppressed to 1 μm or less.

2 Claims, 3 Drawing Sheets

PROCESS FOR MANUFACTURING A SEMICONDUCTOR DEVICE USING NH₄OH-H₂O₂ BASED ETCHANT FOR TI BASED THIN FILM

BACKGROUND OF THE INVENTION

The present invention relates to an etching solution for a titanium-based thin film and a process for manufacturing a semiconductor device using this etching solution. More particularly, the present invention concerns an etching solution and a manufacturing process when fine-pattern metal electrodes and metal wirings are formed by using a titanium-based thin film in a process of manufacturing a semiconductor device.

Conventionally, it is known that hydrofluoric acid-based solutions are generally used when titanium-based thin films are etched in the process of manufacturing semiconductor devices. For example, it is stated in Japanese Patent Unexamined Publication No. 124726/1984 that, in a case where platinum or gold is used as a wiring material, in patterning the material into a fine pattern, a titanium-based thin film is formed on a platinum or gold thin film, the titanium-based thin film is subjected to patterning by a photolithographic etching process using a resist, and etching is performed with aqua regia by using the patterned titanium-based thin film as a protective film, thereby forming a platinum or gold wiring pattern. The publication discloses that an about 5% hydrofluoric acid solution is used in etching the titanium-based thin film.

In addition, Japanese Patent Unexamined Publication No. 124726/1984 discloses that, in a case where a titanium-based thin film is formed as a protective metal layer for a wiring electrode formed of aluminum, in patterning the titanium-based thin film, since there arises a need to selectively etch the titanium-based thin film with respect to the lower aluminum layer, an ethylene diamine tetraacetic acid—NH₄OH—H₂O₂—H₂O-based etching solution is used.

However, if the aforementioned hydrofluoric acid-based etching solution is used, at a time when a titanium-based thin film having a thickness of 1000 angstroms or thereabouts is subjected to patterning by etching using a resist pattern 31 so as to form a metal electrode or a metal wiring pattern 32, as shown in FIG. 3(a), irregularities of 1 μm or thereabouts occur on end faces 33 of the pattern formed by etching, and an amount of side etching at a portion below an end of the resist pattern 31 becomes large at 1 to 3 μm or thereabouts. Hence, there has been a problem in that this process is unsuitable for patterning for fine processing.

Accordingly, in a case where a source electrode 41 and a drain electrode 42 of a thin-film transistor (TFT) is fabricated by using, for instance, a titanium-based thin film, if the amount of side etching is large, as shown in FIG. 3(b), it is impossible to effect patterning along the resist pattern 31. As a result, amounts of overlap 11 and 12 between the source electrode 41 side and the drain electrode 42 side on the one hand, and a channel protecting layer 44 on a channel layer (semiconductor active layer) 43 on the other, become non-uniform (defective overlaps), thereby resulting in variations in the on-state current of the TFTs.

In addition, according to Japanese Patent Unexamined Publication No. 138235/1980, the ethylene diamine tetraacetic acid—NH₄OH—H₂O₂—H₂O-based etching solution is used to take a selectivity ratio between a titanium thin film and an aluminum thin film which is at the lower layer when the aluminum thin film and the titanium thin film are laminated. However, in cases where the titanium thin film in the lower layer is a glass substrate, an $SiN_x$ film, an $SiO_2$ film, or an a—Si:H film, such a material is unaffected by an NH₄OH-based etching solution, so that the ethylene diamine tetraacetic acid is not required in the etching solution.

SUMMARY OF THE INVENTION

The present invention has been devised in view of the above-described circumstances, and its object is to provide an etching solution for a titanium-based thin film which permits fine processing by reducing the amount of side etching and the like when a titanium-based thin film having a thickness of 1000 angstroms or thereabouts is subjected to patterning, as well as a process for manufacturing a semiconductor device by using this etching solution.

To overcome the above-described drawbacks of the conventional art, the present invention provides an etching solution for a titanium-based thin film essentially consisting of an NH₄OH—H₂O₂—H₂O-based etching solution wherein an ammonia concentration is 3% or less.

In one embodiment, the present invention is characterized in that, in the etching solution for a titanium-based thin film the pH value is 10 or less.

In another embodiment in accordance with the present invention there is provided a process for manufacturing a semiconductor device, comprising the steps of: forming a titanium-based thin film on a glass substrate, an $SiN_x$ film, an $SiO_2$ film, or an a—Si:H film; forming a resist pattern of the titanium-based thin film; patterning the titanium-based thin film with an NH₄OH—H₂O₂—H₂O-based etching solution having an ammonia concentration of 3% or less, so as to form a metal electrode or a metal wiring.

In accordance with another embodiment of the present invention wherein an NH₄OH—H₂O₂—H₂O-based etching solution having a pH of 10 or less is used in the process for manufacturing a semiconductor device, barrier metal layers of a source electrode and a drain electrode of a thin-film transistor are formed of the metal electrode composed of the titanium-based thin film.

In accordance with the present invention, if a resist pattern is formed on a titanium-based thin film, and the titanium-based thin film is etched with the NH₄OH—H₂O₂—H₂O-based etching solution with an ammonia concentration of 3% or less, irregularities on the pattern faces due to etching can be eliminated, and the amount of side etching at the titanium thin film below the resist pattern ends can be suppressed to 1 μm or less.

In accordance with the present invention, since, in a process for manufacturing a semiconductor device, a metal electrode or a metal wiring is formed by patterning a titanium-based thin film with the NH₄OH—H₂O₂—H₂O-based etching solution having an ammonia concentration of 3% or less, it is possible to effect the fine processing of electrodes or wirings.

Ammonia NH₃ is commercially available as ammonia water NH₄OH containing about 15% by weight of ammonia NH₃. The etching solution in accordance with the present invention can be obtained by mixing ammonia water, hydrogen peroxide, and water, but it is necessary to set a final ammonia concentration (wt %) in the etching solution to 3% or less. An NH₃ concentration (y) is defined by the following formula if it is assumed that the ammonia concentration in the initially used ammonia water NH₄OH is x (wt %):

$$y = \frac{(\text{weight of ammonia water} \times /100)}{(\text{weight of ammonia water} + \text{weight of hydrogen peroxide} + \text{weight of water})}$$

A lower limit of the ammonia concentration is 0.001 wt %, and the ammonia concentration is preferably in the range of from 0.01 to 3.0 wt %, more preferably in the range of from 0.1 to 2.5 wt %.

DETAILED DESCRIPTION OF THE PREFERRED EMBODIMENTS

Figure 2A:
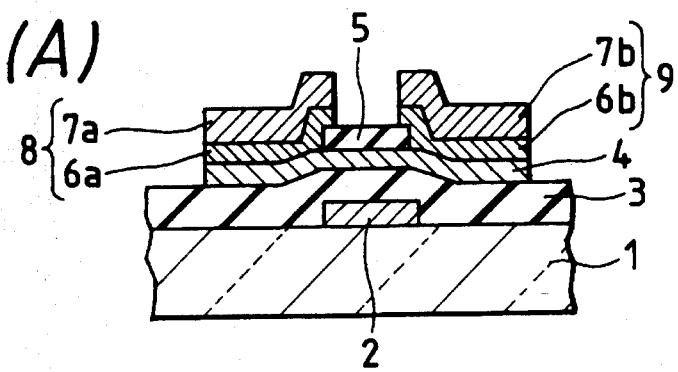
FIGS. 2(a) to 2(c) are manufacturing step drawings illustrating the process for manufacturing a thin-film transistor in accordance with the process of the present invention.
Figure 2B:
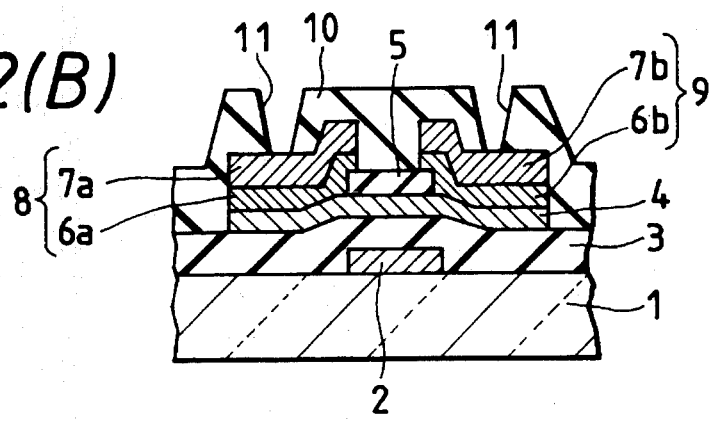
Figure 2C:
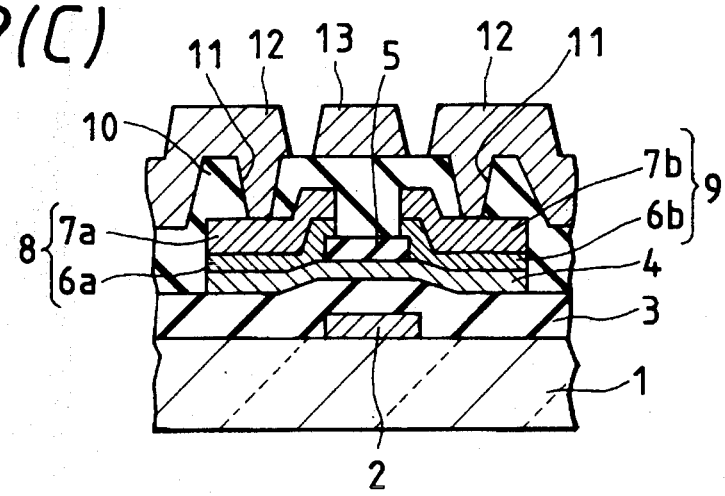
Figure 3A:
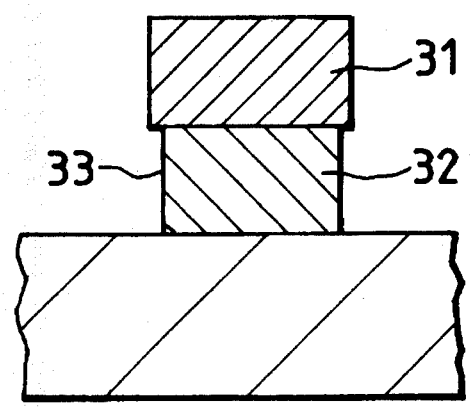
FIGS. 3(a) and 3(b) are explanatory cross-sectional views of a semiconductor device for explaining faulty etching of a titanium thin film.
Figure 3B:
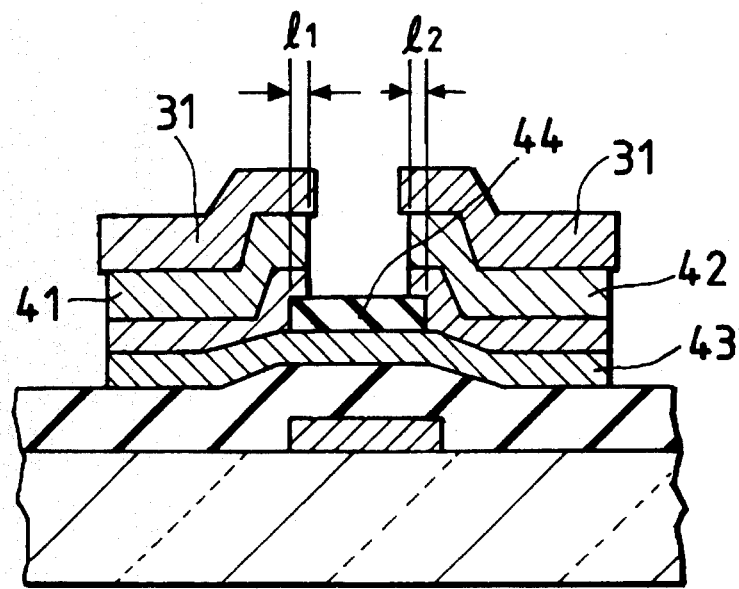

Referring now to FIG. 2(c), a description will be given of the structure of a thin-film transistor (TFT) as an example of a semiconductor device manufactured by the process of the present invention.

A gate electrode 2 is formed on a glass substrate 1, and a gate-insulating film 3 is formed in such a manner as to cover this gate electrode 2. A channel layer 4 consisting of a thin a—Si film is formed on the gate-insulating film 3. A channel-protecting layer 5 which becomes self-aligned with respect to the gate electrode 2 is formed on the channel layer 4'.

A pair of a source electrode 8 and a drain electrode 9 are formed on the channel-protecting layer 5 at a space therebetween in such a manner as to cover opposite ends of the upper insulating layer 5. The source electrode 8 and the drain electrode 9 are formed by ohmic contact layers 6a, 6b composed of $n^+$ a—Si:H films or the like and barrier metal layers 7a, 7b composed of titanium thin films.

The source electrode 8 and the drain electrode 9 are covered with an insulating layer 10 formed of a polyimide or the like, and are connected to wiring portions 12 formed of aluminum or the like through contact holes 11 provided in the insulating layer 10. In addition, a channel light-shielding portion 13 is formed on the insulating layer 10 at a position above the channel-protecting layer 5.

Next, referring to FIGS. 1(a) to 1(d) and FIGS. 2(a) to 2(c), a description will be given of the process for manufacturing the above-described thin-film transistor.

Figure 1A:
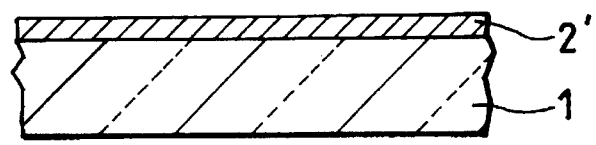
FIGS. 1(a) to 1(d) are manufacturing step drawings illustrating the process for manufacturing a thin-film transistor in accordance with the process of the present invention.

Ta, Mo, or alloys thereof, or Ti, W, Cr or the like are deposited on the entire surface of the glass substrate 1 by means of a vacuum deposition process, a sputtering process or the like to form a metal film 2' having a thickness of 1000 angstroms (FIG. 1(a)). Then, after a photoresist pattern is formed on the metal film 2', the metal film 2' is subjected to dry etching by means of an etching gas such as $SF_6$, thereby effecting patterning and forming the gate electrode 2.

Figure 1B:
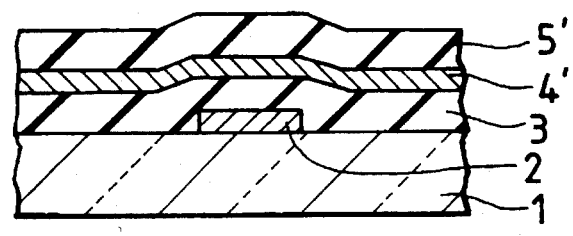
Figure 1C:
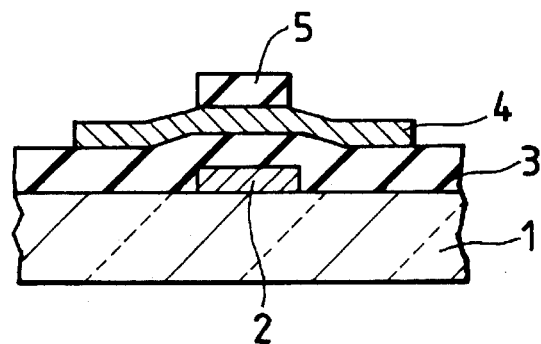

Next, the gate-insulating film 3 formed of $SiN_x$, a semiconductor active layer 4' formed of an a—Si film, and a channel-protecting film 5' formed of $SiN_x$ are continuously deposited by means of a plasma CVD process (FIG. 1(b)).

To describe the deposition conditions of the respective films, first, the deposition conditions of SiNx which is deposited as the gate-insulating film 3 were set as follows: the flow rate of the $SiH_4$ gas: 25 sccm; the flow rate of the $NH_3$ gas: 225 sccm; gas pressure: 0.2 Torr; substrate temperature: 300–350° C.; and film thickness: 200–300 nm.

The deposition conditions of the semiconductor active layer 4' (a—Si film) were set as follows: the flow rate of the $SiH_4$ gas: 250 sccm; gas pressure: 0.3 Torr; substrate temperature: 200–300° C.; and film thickness: 10–100 nm.

The deposition conditions of $SiN_x$ which is deposited as the channel-protecting film 5' were set as follows: the flow rate of the $SiH_4$ gas: 35 sccm; the flow rate of the $NH_3$ gas: 240 sccm; gas pressure: 0.2 Torr; substrate temperature: 200–300° C.; and film thickness: 50–200 nm.

Next, to pattern the channel-protecting film 5' in a self-aligning manner with respect to the gate electrode 2, after a resist (not shown) is coated on the channel-protecting film 5', exposure is effected from the reverse surface of the glass substrate 1 whereby the resist in a region other than the portion of the nontranslucent gate electrode 2 was exposed to light and was developed, thereby forming a resist pattern. Etching was carried out by using this resist pattern as a mask to subject the channel-protecting film 5' to patterning, thereby forming the channel-protecting film 5. Furthermore, the semiconductor active layer 4' was subjected to patterning, thereby forming the channel layer 4 (FIG. 1(c)).

Figure 1D:
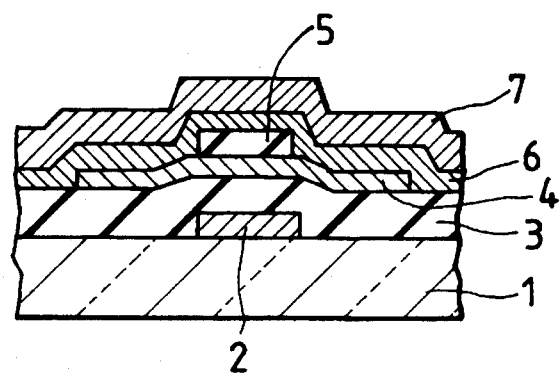

Subsequently, an ohmic contact film 6 formed of the $n^+$ a—Si film for forming the ohmic contact was deposited to a thickness of 1000 angstroms, and a titanium thin film 7 formed of a titanium (Ti)-based metal is deposited on the entire surface to a thickness of 2000 angstroms by means of the vacuum deposition process or the sputtering process (FIG. 1(d)).

A resist pattern (not shown) is formed on the titanium thin film 7, the titanium thin film 7 is subjected to patterning by etching, and the ohmic contact film 6 is subjected to patterning by etching. Thus, the source electrode 8 and the drain electrode 9 (FIG. 2(a)) comprising the barrier metal layers 7a, 7b and the ohmic contact layers 6a, 6b are formed (FIG. 2(a)).

The etching of the titanium thin film 7 is carried out by setting the solution temperature at 30° or more and by using an $NH_4OH$—$H_2O_2$—$H_2O$-based etching solution in which the compositions of $NH_4OH$ (ammonium), $H_2O_2$, and $H_2O$ were 33 ml or less, 100 ml, and 200 ml, respectively, and the ammonia concentration is 3% or less. By using this etching solution, when the titanium thin film 7 is etched, it is possible to prevent the formation of irregularities at pattern end faces of the barrier metal layers 7a, 7b, and to set the amount of side etching at end faces of the titanium thin film 7 below the resist pattern to 1 µm or less.

The present inventor conducted the etching of the titanium thin film 7 under the same conditions as those described above by using three kinds of $NH_4OH$—$H_2O_2$—$H_2O$-based etching solutions in which the amounts of $H_2O_2$ and $H_2O$ were not changed and were set to 100 ml and 200 ml, and only the amount of ammonia was increased, respectively. As a result, in the respective cases, the irregularities on the pattern end faces of the titanium thin film 7 and the amount of side etching increased in comparison with the etching solutions containing not more than 33 ml of ammonia.

That is, to perform fine processing with respect to the resist pattern, it is necessary to set the ammonia concentration in the $NH_4OH$—$H_2O_2$—$H_2O$-based etching solution to 3% or less. Conceivably, this is due to the fact that the pH value of the etching solution becomes 10 or less as the ammonia concentration is set to 3% or less.

In addition, since the ohmic contact film 6 in the layer below the titanium thin film 7 is formed of the $n^+a$—Si film, the ohmic contact film 6 is unaffected by the $NH_4OH$-based etching solution.

Then, a polyimide is coated to a thickness of 1 μm or thereabouts by means of roll coating or spin coating to form the insulating layer 10. In the insulating layer 10, the contact holes 11 are provided in portions corresponding to the source electrode 8 and the drain electrode 9 (FIG. 2(b)). Subsequently, a metal film of aluminum or the like is deposited to a thickness of 1 μm or thereabouts by the vacuum deposition process or the sputtering process. This metal film is subjected to patterning to form the wiring portions 12 and the channel light-shielding portion 13 above the channel-protecting layer 5, thereby completing the thin-film transistor (TFT) (FIG. 2(c)).

In accordance with the above-described embodiment, since the patterning of the titanium thin film 7 is effected with the $NH_4OH$—$H_2O_2$—$H_2O$-based etching solution with an ammonia concentration of 3% or less when the barrier metal layers 7a, 7b constituting the source electrode 8 and the drain electrode 9 of the thin-film transistor are formed of the titanium thin film 7, the irregularities on the pattern faces can be reduced, and the amount of side etching can be suppressed to 1 μm or less. Hence, the fine processing of the titanium thin film 7 can be effected accurately. Accordingly, even with respect to overlapping portions between the source electrode 8 and the drain electrode 9 on the one hand, and the channel-protecting layer 5 on the other, the titanium thin film 7 can be patterned along the resist pattern. As a result, faulty overlapping can be prevented, and the characteristics of the TFT (on-state current characteristics) can be made uniform.

Although, in the above-described embodiment, the present invention has been described by citing as one example the process for manufacturing a thin-film transistor, the etching solution in accordance with the present invention is effective in a case where the layer below the titanium thin film is a glass substrate, an $SiN_x$ film, an $SiO_2$ film, or an a—Si:H film in a process for manufacturing a semiconductor device including a step of fine processing a titanium thin film, e.g., in a case where a photodiode electrodes fabricated in a thin-film process are formed of a titanium thin film.

In accordance with the present invention, when the $NH_4OH$—$H_2O_2$—$H_2O$-based etching solution with an ammonia concentration of 3% or less is used, if a resist pattern is formed on a titanium-based thin film and the titanium-based thin film is etched with the etching solution, irregularities on the pattern faces due to etching can be eliminated, and the amount of side etching at the titanium thin film below the resist pattern ends can be suppressed to 1 μm or less. Hence, it is possible to obtain an etching solution suitable for the fine processing of titanium-based thin films.

In accordance with the present invention since, in the process for manufacturing a semiconductor device, a metal electrode or a metal wiring is formed by patterning a titanium-based thin film with the $NH_4OH$—$H_2O_2$—$H_2O$-based etching solution having an ammonia concentration of 3% or less, it is possible to accurately effect the fine processing of electrodes or wirings, and to prevent the nonuniformity of characteristics of the semiconductor devices caused by the offsetting of the pattern of the titanium-based thin film.

What is claimed is:

1. A process for manufacturing a semiconductor device, comprising the steps of:

forming a titanium-based thin film on a glass substrate, an $SiN_x$ film, an $SiO_2$ film, or an a—Si:H film;

forming a resist pattern of said titanium-based thin film; and patterning said titanium-based thin film with an etching solution consisting essentially of ammonia, hydrogen peroxide, and water and having an ammonia concentration of 0.001 to 3 wt %, so as to form a metal electrode or a metal wiring.

2. A process for manufacturing a semiconductor device according to claim 1, wherein barrier metal layers of a source electrode and a drain electrode of a thin-film transistor are formed of said metal electrode.

* * * * *